US 9,070,619 B2

(12) United States Patent
Tsuchiya

(10) Patent No.: US 9,070,619 B2
(45) Date of Patent: Jun. 30, 2015

(54) NITRIDE SEMICONDUCTOR WAFER FOR A HIGH-ELECTRON-MOBILITY TRANSISTOR AND ITS USE

(71) Applicant: Hitachi Metals, Ltd., Tokyo (JP)

(72) Inventor: Tadayoshi Tsuchiya, Ishioka (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 13/962,812

(22) Filed: Aug. 8, 2013

(65) Prior Publication Data
US 2014/0061665 A1 Mar. 6, 2014

(30) Foreign Application Priority Data
Sep. 3, 2012 (JP) ................................. 2012-193047

(51) Int. Cl.
*H01L 29/66* (2006.01)
*H01L 29/205* (2006.01)
*H01L 21/02* (2006.01)
*H01L 29/778* (2006.01)
*H01L 29/10* (2006.01)
*H01L 29/20* (2006.01)
*H01L 29/207* (2006.01)

(52) U.S. Cl.
CPC ........ *H01L 29/205* (2013.01); *H01L 21/02458* (2013.01); *H01L 21/02507* (2013.01); *H01L 21/0254* (2013.01); *H01L 21/02579* (2013.01); *H01L 21/02581* (2013.01); *H01L 21/0262* (2013.01); *H01L 29/7783* (2013.01); *H01L 29/1075* (2013.01); *H01L 29/2003* (2013.01); *H01L 29/207* (2013.01)

(58) Field of Classification Search
CPC ..................... H01L 21/02458; H01L 21/0257; H01L 21/0254; H01L 21/02579; H01L 29/7783; H01L 21/0262; H01L 29/2003
USPC .................. 257/11, 189, 190, 191, 194, 615, 257/E33.023, E33.025, E33.028, E29.089, 257/E21.097, E21.108, E21.127
See application file for complete search history.

(56) References Cited

U.S. PATENT DOCUMENTS 7,112,830 B2 * 9/2006 Munns .......................... 257/190
8,212,288 B2 7/2012 Komiyama et al.
(Continued)

FOREIGN PATENT DOCUMENTS

JP        2011-82494 A       4/2011

OTHER PUBLICATIONS

O. Ambacher et al. "Two dimensional electron gases induced by spontaneous and piezoelectric polarization in undoped and doped AlGAN/GAN heterostructures", Journal of Applied Physics vol. 87, No. 1, Jan. 1, 2000.

*Primary Examiner* — Cuong Q Nguyen
*Assistant Examiner* — Yosef Gebreyesus
(74) *Attorney, Agent, or Firm* — McGinn IP Law Group, PLLC

(57) ABSTRACT

A nitride semiconductor wafer includes a substrate, and a buffer layer formed on the substrate and including an alternating layer of $Al_xGa_{1-x}N$ ($0 \leq x \leq 0.05$) and $Al_yGa_{1-y}N$ ($0 < y \leq 1$ and $x < y$) layers. Only the $Al_yGa_{1-y}N$ layer in the alternating layer is doped with an acceptor.

20 Claims, 4 Drawing Sheets

(56) References Cited

U.S. PATENT DOCUMENTS

| | | | |
|---|---|---|---|
| 2003/0109076 A1* | 6/2003 | Senda et al. | 438/46 |
| 2003/0178633 A1* | 9/2003 | Flynn et al. | 257/101 |
| 2004/0261692 A1* | 12/2004 | Dwilinski et al. | 117/84 |
| 2005/0006639 A1* | 1/2005 | Dupuis et al. | 257/20 |
| 2006/0261356 A1* | 11/2006 | Iwakami et al. | 257/80 |
| 2007/0217458 A1* | 9/2007 | Kitano et al. | 372/43.01 |
| 2009/0078943 A1* | 3/2009 | Ishida et al. | 257/77 |
| 2010/0289067 A1* | 11/2010 | Mishra et al. | 257/268 |
| 2011/0062556 A1 | 3/2011 | Komiyama et al. | |
| 2012/0175589 A1* | 7/2012 | Ooshika et al. | 257/13 |
| 2012/0326209 A1* | 12/2012 | Ooshika et al. | 257/183 |
| 2013/0214281 A1* | 8/2013 | Li et al. | 257/76 |

* cited by examiner

1 NITRIDE SEMICONDUCTOR WAFER
- 13b
- 13a
- 13b
- 13a $Al_xGa_{1-x}N$ LAYER
- 13b $Al_yGa_{1-y}N$ LAYER
- 13 BUFFER LAYER
- 12 GaN BUFFER LAYER
- 11 SUBSTRATE

2 HEMT
- 23, 25, 24
- 22 BARRIER LAYER
- 21 CHANNEL LAYER
- 13b, 13a, 13b, 13a, 13b — 13
- 12
- 11

NITRIDE SEMICONDUCTOR WAFER FOR A HIGH-ELECTRON-MOBILITY TRANSISTOR AND ITS USE

The present application is based on Japanese patent application No. 2012-193047 filed on Sep. 3, 2012, the entire contents of which are incorporated herein by reference.

BACKGROUND OF THE INVENTION

1. Field of the Invention

The invention relates to a nitride semiconductor wafer.

2. Description of the Related Art

When a device structure with a heterojunction, such as high-electron-mobility transistor (HEMT), is formed on a (111) plane or a C plane [(0001) plane] of a conductive or semi-insulating semiconductor substrate formed of Si, SiC or GaN, etc., a buffer layer is required to have high insulating properties. However, sufficient insulating properties are not necessarily obtained in case of using a single-layered buffer layer since an energy barrier is not present in the buffer layer and free electrons injected into the buffer layer thus move easily.

In order to improve insulating properties, use of a buffer layer including a heterojunction formed between, e.g., an aluminum gallium nitride (AlGaN) layer and a gallium nitride (GaN) layer is effective but an induced charge, which is caused by a polarization effect characteristic of the nitride semiconductor, impedes improvement in insulating properties. In an AlGaN/GaN heterojunction structure stacked in a c-axis direction, free carriers of opposite sign are likely to be induced at an interface due to spontaneous and piezo polarizations inherent in nitride-based semiconductor crystal. In the buffer layer including a heterojunction as described above, a polarization moment depends on an Al composition x of an $Al_xGa_{1-x}N$ layer and polarization charge density thus depends on the Al composition x (see, e.g., Non-patent literature: Journal of Applied Physics, Vol. 87, page 334 (2000) by O Ambacher et al). According to Non-patent literature, a charge $\sigma P_{sp}/e$, which is equivalent to a difference between spontaneous polarization inherently present in the AlGaN layer and that inherently present in the GaN layer, is induced at an interface between the AlGaN layer and the GaN layer. In addition, a charge $\sigma P_{pe}/e$, which is equivalent to a difference between piezo polarization in the AlGaN layer caused by elastic stress generated in the AlGaN layer in response to an external force and that in the GaN layer caused by elastic stress generated in the GaN layer in response to an external force, is induced at the interface between the AlGaN layer and the GaN layer. Accordingly, $\sigma/e\ (P_{sp}+P_{pe})$ as the total of $\sigma P_{sp}/e$ and $\sigma P_{pe}/e$ is equivalent to the total polarization charge induced at the interface between the AlGaN layer and the GaN layer.

Then, when a relation between the Al composition x in the composition formula $Al_xGa_{1-x}N$ of the AlGaN layer and $\rho/e\ (P_{sp}+P_{pe})$ is derived by an experiment, a curve representing this relation is expressed by a relational expression: $\sigma/e\ (P_{sp}+P_{pe})=5\times10^{13}\cdot x$ ($x\leq0.6$), $\sigma/e\ (P_{sp}+P_{pe})=1\times10^{14}\cdot x-3\times10^{13}$ ($x>0.6$).

That is, according to Non-patent literature, when, in the buffer layer having an AlGaN/GaN heterojunction structure, the composition formula of the AlGaN layer is defined as $Al_xGa_{1-x}N$ and polarization charge density at each interface between the AlGaN layer and the GaN layer in the buffer layer is defined as Np, the relation is expressed by approximately $Np=5\times10^{13}\cdot x$ (cm$^{-2}$) when $x\leq0.6$ and approximately $Np=1\times10^{14}\cdot x-3\times10^{13}$ (cm$^{-2}$) when $x>0.6$. When the Al composition x is, e.g., 0.1, the polarization charge density Np is approximately $5\times10^{12}$ (cm$^{-2}$).

The polarization charge induces a charge of opposite sign at both ends of a layer but is electrically neutral when the AlGaN/GaN heterojunction structure is independent, hence does not cause any problems. However, once an active layer such as a HEMT structure is formed on an upper layer of the heterojunction structure, it causes variation in a band diagram and the neutrality conditions are partially unsatisfied. In a HEMT epi structure which is a monopolar device having free electrons as a carrier, electrons are likely to be preferentially induced also at an AlGaN/GaN interface in the buffer layer. In order to suppress this, introduction of an acceptor into the buffer layer is considered to be effective.

A compound semiconductor substrate is known in which carbon is doped into the entirety of a multilayer buffer layer as an alternating layer formed of two types of aluminum gallium nitride layers having different compositions (see, e.g., JP-A-2011-82494). According to JP-A-2011-82494, the withstand voltage performance of a device can be improved by configuring the multilayer buffer layer to contain carbon.

SUMMARY OF THE INVENTION

When carbon is doped into the entire multilayer buffer layer as is the compound semiconductor substrate disclosed in JP-A-2011-82494, it is highly likely that carbon functioning as an acceptor captures also free electrons in a channel layer, which causes an increase in on-resistance of the device and deterioration of the device properties.

It is an object of the invention to provide a nitride semiconductor wafer that has a buffer layer including a heterojunction and can be used for manufacturing a device excellent in on-resistance characteristics and buffer leakage characteristics.

(1) According to one embodiment of the invention, a nitride semiconductor wafer comprises:

a substrate; and a buffer layer formed on the substrate and comprising an alternating layer of an $Al_xGa_{1-x}N$ ($0\leq x\leq0.05$) layer and an $Al_yGa_{1-y}N$ ($0<y\leq1$ and $x<y$) layer, wherein only the $Al_yGa_{1-y}N$ layer of the alternating layer is doped with (or comprises) an acceptor.

In the above embodiment (1) of the invention, the following modifications and changes can be made.

(i) A sheet concentration Ns of the acceptor in an uppermost $Al_yGa_{1-y}N$ layer among the $Al_yGa_{1-y}N$ layer of the alternating layer is not more than $2\times10^{13}$ cm$^{-2}$.

(ii) An Al composition y of the uppermost $Al_yGa_{1-y}N$ layer is $0<y\leq0.4$, and wherein the sheet concentration Ns is $5\times10^{13}\cdot y<Ns\leq2\times10^{13}$ cm$^{-2}$.

(iii) The acceptor comprises one of iron (Fe), carbon (C) and zinc (Zn).

(iv) An Al composition x of the $Al_xGa_{1-x}N$ layer is x=0.

(v) The Al composition y and the sheet concentration Ns per layer are each equal in the $Al_yGa_{1-y}N$ layer of the alternating layer.

(vi) The $Al_xGa_{1-x}N$ layer of the alternating layer is not doped with the acceptor.

Effects of the invention

According to one embodiment of the invention, a nitride semiconductor wafer can be provided that has a buffer layer including a heterojunction and can be used for manufacturing a device excellent in on-resistance characteristics and buffer leakage characteristics.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Summary of the Embodiment

One embodiment of the invention is to provide a nitride semiconductor wafer having a substrate and a buffer layer formed on the substrate and including an alternating layer of $Al_xGa_{1-x}N$ ($0 \leq x \leq 0.05$) and $Al_yGa_{1-y}N$ ($0 < y \leq 1$ and $x < y$) layers, wherein only the $Al_yGa_{1-y}N$ layers in the alternating layer contain an acceptor.

In case that a device such as HEMT is manufactured using the nitride semiconductor wafer, it is possible to effectively suppress an induced charge caused by a polarization charge generated at a heterointerface between the $Al_xGa_{1-x}N$ layer and the $Al_yGa_{1-y}N$ layer by configuring the alternating layer so that the $Al_xGa_{1-x}N$ layer does not contain an acceptor and only the $Al_yGa_{1-y}N$ layer contains an acceptor. Furthermore, by setting an acceptor concentration in the $Al_yGa_{1-y}N$ layer to an appropriate value, it is possible to suppress generation of free carrier in the buffer layer and thus to ensure high insulating properties while suppressing reduction in carrier conduction by minimizing the capture of free electrons in the channel layer 21 by the acceptor.

Embodiment

Structure of Nitride Semiconductor Wafer

Figure 1A:
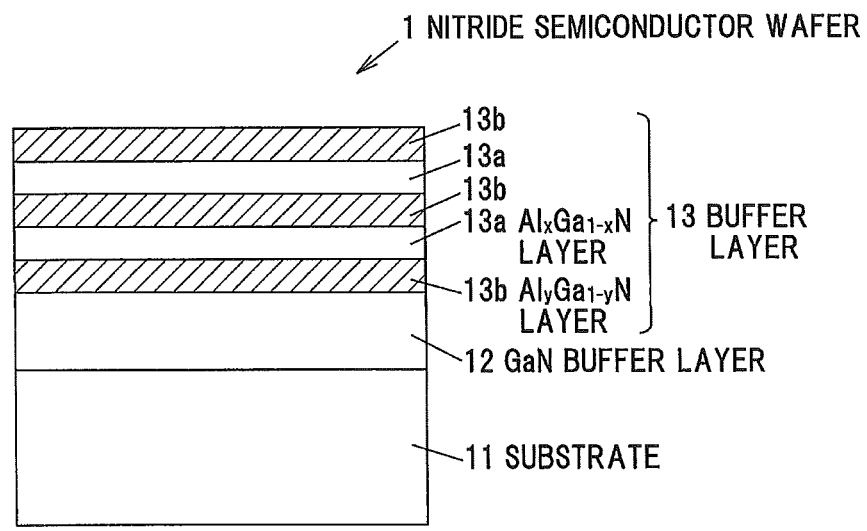
FIG. 1A is a vertical cross sectional view showing a nitride semiconductor wafer in an embodiment.
Figure 1B:
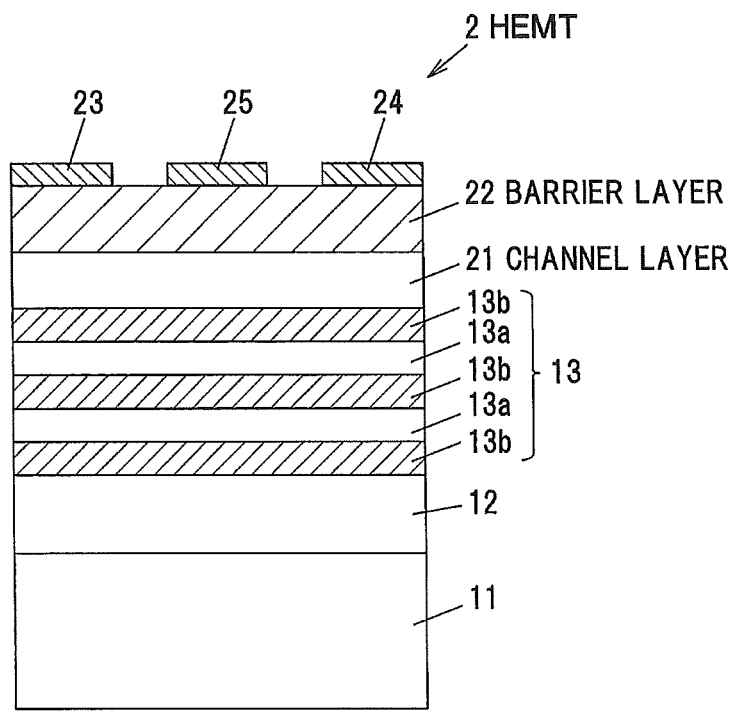
FIG. 1B is a vertical cross sectional view showing a HEMT formed using the nitride semiconductor wafer.

FIG. 1A is a vertical cross sectional view showing a nitride semiconductor wafer in the embodiment. FIG. 1B is a vertical cross sectional view showing a HEMT (high-electron-mobility transistor) formed using the nitride semiconductor wafer.

A nitride semiconductor wafer 1 has a substrate 11, a GaN buffer layer 12 on the substrate 11 and a buffer layer 13 on the GaN buffer layer 12. A HEMT 2 has the nitride semiconductor wafer 1, a channel layer 21 on the buffer layer 13 of the nitride semiconductor wafer 1, a barrier layer 22 on the channel layer 21, and a source electrode 23, a drain electrode 24 and a gate electrode 25 which are formed on the barrier layer 22.

The substrate 11 is, e.g., a non-doped GaN substrate or a Fe-doped GaN substrate. In addition, by inserting a layer formed of AlN or AlGaN, called a nucleation layer, between the substrate 11 and the GaN buffer layer 12, it is possible to use a semi-insulating SiC substrate or a Si substrate, etc., as the substrate 11.

The GaN buffer layer 12 is formed of, e.g., GaN crystal. The channel layer 21 is formed of, e.g., GaN crystal or InGaN crystal and has a thickness of 20 nm. The barrier layer 22 is formed of, e.g., AlGaN crystal or InAlN crystal and has a thickness of 25 nm. The source electrode 23 and the drain electrode 24 are formed of, e.g., a laminate of Ti/Al. The gate electrode 25 is formed of, e.g., a laminate of Pd/Au.

The buffer layer 13 is an alternating layer of $Al_xGa_{1-x}N$ layers ($0 \leq x \leq 0.05$) 13a and $Al_yGa_{1-y}N$ layers ($0 < y \leq 1$ and $x < y$) 13b, i.e., a layer formed by alternately laminating the $Al_xGa_{1-x}N$ layer 13a and the $Al_yGa_{1-y}N$ layer 13b. Each of the $Al_xGa_{1-x}N$ layer 13a and the $Al_yGa_{1-y}N$ layer 13b has a thickness of, e.g., 50 nm.

The $Al_xGa_{1-x}N$ layer 13a is formed of $Al_xGa_{1-x}N$ crystal ($0 \leq x \leq 0.05$) and virtually does not contain an acceptor. The $Al_yGa_{1-y}N$ layer 13b is formed of $Al_yGa_{1-y}N$ crystal ($0 < y \leq 1$ and $x < y$) as a parent crystal and contains an acceptor.

In other words, in the alternating layer composed of the $Al_xGa_{1-x}N$ layers 13a and the $Al_yGa_{1-y}N$ layers 13b, only the $Al_yGa_{1-y}N$ layers 13b virtually contain the acceptor. The acceptor is not intentionally doped into the $Al_xGa_{1-x}N$ layer 13a. Therefore, even if the acceptor diffused and transferred from the $Al_yGa_{1-y}N$ layer 13b is present in the $Al_xGa_{1-x}N$ layer 13a, the concentration thereof is very low and is less than lower detection limit for electrical measurement (e.g., not more than $8 \times 10^{16}$ (cm$^{-3}$)).

If both of the $Al_xGa_{1-x}N$ layer 13a and the $Al_yGa_{1-y}N$ layer 13b contain the acceptor, an acceptor level in the $Al_xGa_{1-x}N$ layer 13a pins the Fermi level and this reduces an effect of doping the acceptor into the $Al_yGa_{1-y}N$ layer 13b. As a result, the induced charge caused by the polarization charge is not compensated sufficiently, which may cause a decrease in insulating properties of the buffer layer 13. On the other hand, if the acceptor is doped at a concentration ensuring the insulating properties of the buffer layer 13, the acceptor also captures free electrons in the channel layer and on-resistance of the device is highly likely to increase.

Note that, since it is preferable that polarization charge density of the $Al_xGa_{1-x}N$ layer 13a be smaller, an Al composition x of the $Al_xGa_{1-x}N$ layer 13a is preferably 0 (x=0).

In addition, the number of the $Al_xGa_{1-x}N$ layers 13a and that of the $Al_yGa_{1-y}N$ layers 13b are not limited to those shown in FIGS. 1A and 1B. In addition, in the buffer layer 13, the number of the $Al_xGa_{1-x}N$ layers 13a may be the same as the number of the $Al_yGa_{1-y}N$ layers 13b, or the number of one of the $Al_xGa_{1-x}N$ layers 13a and the $Al_yGa_{1-y}N$ layers 13b may be one more than the number of the other.

As the acceptor contained in the $Al_yGa_{1-y}N$ layer 13b, it is possible to use a group II metal such as beryllium (Be), magnesium (Mg), calcium (Ca), zinc (Zn) or cadmium (Cd), a transition metal such as iron (Fe) or manganese (Mn), or an amphoteric impurity such as carbon (C). Among the above, Fe, Zn or C is preferable as an acceptor in the present embodiment from the viewpoint of the ease of doping, and C is particularly preferable.

Preferably, in at least the uppermost $Al_yGa_{1-y}N$ layer 13b among the $Al_yGa_{1-y}N$ layers 13b of the buffer layer 13, an Al composition y is greater than 0 and not more than 0.4 ($0 < y \leq 0.4$) and a sheet concentration Ns of the acceptor is greater than $5 \times 10^{13} \cdot y$ and not more than $2 \times 10^{13}$ cm$^{-2}$ ($5 \times 10^{13} \cdot y < Ns < 2 \times 10^{13}$ (cm$^{-2}$)).

When the sheet concentration Ns of the acceptor in the uppermost $Al_yGa_{1-y}N$ layer 13b is not more than $5 \times 10^{13} \cdot y$, it is not possible to sufficiently compensate the induced charge which is caused by the polarization charge generated at a heterointerface between the $Al_xGa_{1-x}N$ layer 13a and the $Al_yGa_{1-y}N$ layer 13b and it may therefore not be possible to sufficiently suppress buffer leakage current. On the other hand, when the sheet concentration Ns of the acceptor is higher than $2\times10^{13}$ ($cm^{-2}$), the acceptor may capture free electrons in the channel layer 21, causing an increase in on-resistance of the HEMT 2.

Meanwhile, when the Al composition y of the uppermost $Al_yGa_{1-y}N$ layer 13b is greater than 0.4, the amount of the induced charge caused by the polarization charge becomes excessive and an acceptor at the sheet concentration Ns of higher than $2\times10^{13}$ ($cm^{-2}$) may be required in order to compensate the excessive induced charge.

In the second from the top and following $Al_yGa_{1-y}N$ layers 13b, the Al composition y and the sheet concentration Ns of the acceptor per layer may be different from those of the uppermost $Al_yGa_{1-y}N$ layer 13b. However, in order to suppress the buffer leakage current as much as possible while suppressing an effect on a free electron concentration in the channel layer 21 as much as possible, it is preferable to satisfy the same conditions as the uppermost layer which are "the Al composition y is $0<y\leq0.4$ and the sheet concentration Ns of the acceptor is $5\times10^{13}\cdot y<Ns\leq2\times10^{13}$ ($cm^{-2}$)". In addition, it is more preferable that the Al composition y and the sheet concentration Ns of the acceptor be respectively equal in all of the $Al_yGa_{1-y}N$ layers 13b.

Effects of the Embodiment

In the present embodiment, by configuring the buffer layer 13 such that the $Al_xGa_{1-x}N$ layer 13a does not contain the acceptor and only the $Al_yGa_{1-y}N$ layer 13b contains an acceptor, it is possible to effectively suppress the induced charge caused by the polarization charge generated at the heterointerface between the $Al_xGa_{1-x}N$ layer 13a and the $Al_yGa_{1-y}N$ layer 13b. Furthermore, by setting an acceptor concentration in the $Al_yGa_{1-y}N$ layer 13b to an appropriate value defined in the embodiment, it is possible to suppress generation of free carrier in the buffer layer 13 and thus to ensure high insulating properties while suppressing reduction in carrier conduction by minimizing the capture of free electrons in the channel layer 21 by the acceptor.

Therefore, by using the nitride semiconductor wafer 1 of the present invention, it is possible to manufacture a device such as the HEMT 2 which is excellent in on-resistance characteristics and buffer leakage characteristics.

Other Embodiments

Although the embodiment of the invention has been described, the invention is not intended to be limited to the embodiment, and the various kinds of modifications can be implemented without departing from the gist of the invention.

For example, a layer formed of InAlN crystal can be used in the buffer layer 13 instead of using the $Al_xGa_{1-x}N$ layer 13a and the $Al_yGa_{1-y}N$ layer 13b. In such a case, the density of the generated polarization charge and the acceptor concentration required to obtain the same effect as the above-mentioned embodiment may be different from those of the $Al_xGa_{1-x}N$ layer 13a and the $Al_yGa_{1-y}N$ layer 13b.

EXAMPLE

The HEMT 2 in the above-mentioned embodiment were made and various evaluations were performed. The methods and results of the evaluations will be described below.

Manufacturing of Buffer Layer

A method of manufacturing the buffer layer 13 used in the present example will be described.

The $Al_xGa_{1-x}N$ layer 13a and the $Al_yGa_{1-y}N$ layer 13b were formed by an organometallic vapor phase growth method. For the below-described various evaluations, plural HEMTs 2 having the $Al_yGa_{1-y}N$ layer 13b with different Al composition y and different acceptor concentration were formed. Note that, the Al composition x of the $Al_xGa_{1-x}N$ layer 13a was fixed to 0.

Trimethylgallium or triethylgallium was used as a Ga source material. Trimethylaluminum was used as an Al source material. A nitrogen source material used was ammonium and partially a hydrazine-based material. A group III material or $CBr_4$ was used for a C source material as an acceptor. $FeCl_3$ was used for a Fe source material as an acceptor. Dimethyl zinc was used for a Zn source material as an acceptor.

C was intermittently doped during growth of an AlGaN crystal while appropriately changing a V/III ratio (a ratio of a group V source material concentration to a group III source material concentration), film formation temperature (susceptor temperature) and growth pressure, thereby forming the $Al_xGa_{1-x}N$ layer 13a and the $Al_yGa_{1-y}N$ layer 13b. Then, the layers having a desired C concentration were separated and selected by elemental analysis and the below-described evaluations were performed. Here, the V/III ratio was adjusted within a range of about 10 to 100,000. The film formation temperature was adjusted within a range of about 800 to 1250° C. The growth pressure was adjusted within a range of about 10 k to 100 kPa. Hydrogen, nitrogen or a mixture gas thereof was used as a carrier gas, and a mixed ratio of the mixture gas was adjusted on an as-needed basis.

No difference was observed in the below-described evaluation results of the HEMT 2 even when the film forming conditions were changed. It is considered that the characteristics of the HEMT 2 are primarily fixed by the Al composition and the concentration of the acceptor such as C and do not really depend on the film forming conditions.

In addition, although a non-doped GaN substrate and a Fe-doped GaN substrate were used as the substrate 11, no difference was observed in the evaluation results in both cases. Furthermore, although a combination of a GaN layer with a AlGaN layer and a combination of an InGaN layer with an InAlN layer were used for the channel layer 21 and the barrier layer 22, no difference was observed in the evaluation results in both cases.

Evaluation of Insulating Properties of Buffer Layer

Figure 2:
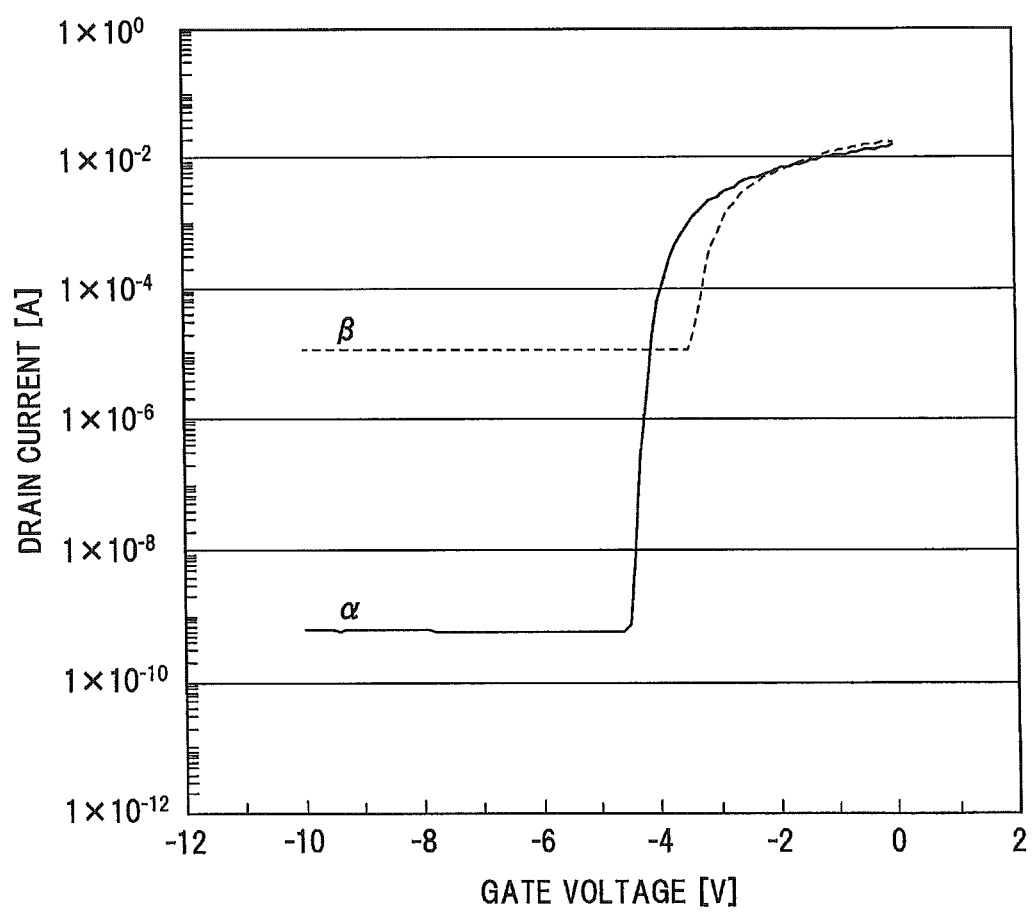
FIG. 2 is a graph showing a relation between gate voltage and buffer leakage current in a HEMT of the present embodiment and that that in a HEMT of Comparative Example.

FIG. 2 is a graph showing a relation between gate voltage and buffer leakage current in the HEMT 2 of the present embodiment and that in a HEMT of Comparative Example. In FIG. 2, a horizontal axis represents gate voltage (V) and a vertical axis represents a drain current (A) which is a buffer leakage current. The line α represents the measurement result of the HEMT 2 in the present embodiment and the line β represents the measurement result of the HEMT in Comparative Example, The buffer layer 13 of each HEMT 2 used for the measurement is composed of two 50 nm-thick $Al_xGa_{1-x}N$ layers 13a and three 50 nm-thick $Al_yGa_{1-y}N$ layers 13b, and the Al composition y and the sheet concentration Ns of C as an acceptor in the $Al_yGa_{1-y}N$ layer 13b are respectively 0.15 and $2\times10^{13}$ ($cm^{-2}$). C is not intentionally doped into the $Al_xGa_{1-x}N$ layer 13a and it is presumed that the C concentration therein is less than lower detection limit for electrical measurement (not more than $8\times10^{16}$ ($cm^{-3}$)).

Meanwhile, the HEMT in Comparative Example is a transistor in which 50 nm-thick GaN layers not containing an acceptor are formed in place of the $Al_xGa_{1-x}N$ layers 13a in the HEMT 2 used for the measurement and 50 nm-thick GaN layers containing C as an acceptor are formed in place of the $Al_yGa_{1-y}N$ layers 13b. The sheet concentration Ns per C-containing GaN layer is $2\times10^{13}$ $(cm^{-2})$.

The HEMT 2 in the present embodiment and the HEMT in Comparative Example have a gate length of 2 μm and a gate width of 20 μm. The measurement was conducted at a drain voltage of 100V.

According to FIG. 2, while the buffer leakage current of the HEMT in Comparative Example during pinch-off is about $1\times10^{-5}$ (A), the buffer leakage current of the HEMT 2 in the embodiment during pinch-off is not more than $1\times10^{-5}$ (A) which is smaller than the Comparative Example by two orders of magnitude.

The reason why the leakage current is suppressed so much by C at a relatively low sheet concentration Ns of $2\times10^{13}$ $(cm^{-2})$ is physically unknown, however, it is considered that, in the buffer layer 13 of the present embodiment, the polarization charge generated on one surface of the $Al_yGa_{1-y}N$ layer 13b is compensated to the some extent by the polarization charge of the opposite polarity generated on the opposite surface.

Evaluation of Acceptor Concentration Dependence of Insulating Property

Figure 3:
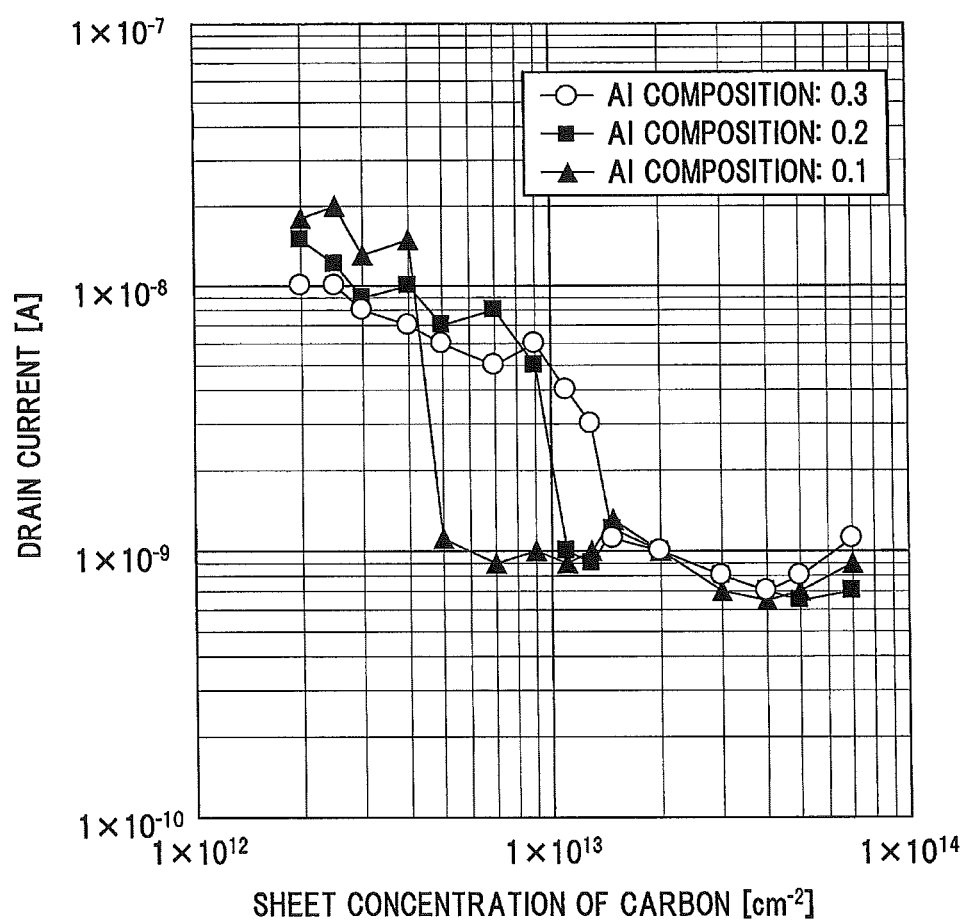
FIG. 3 is a graph showing a relation between a sheet concentration Ns of C in a $Al_yGa_{1-y}N$ layer and buffer leakage current in the HEMT of the present embodiment.

FIG. 3 is a graph showing a relation between a sheet concentration Ns of C as an acceptor in the $Al_yGa_{1-y}N$ layer 13b and a drain current as a buffer leakage current in a pinched-off state produced by applying −8V of gate voltage (Vg) to the HEMT 2. In FIG. 3, a horizontal axis represents the sheet concentration Ns $(cm^{-2})$ of C in the $Al_yGa_{1-y}N$ layer 13b and a vertical axis represents a drain current (A). FIG. 3 shows the measurement results of three types of HEMTs 2 of which $Al_yGa_{1-y}N$ layers 13b respectively have the Al compositions y of 0.1, 0.2 and 0.3. Note that, the structure of the members other than the $Al_yGa_{1-y}N$ layer 13b is the same in all HEMTs 2.

FIG. 3 shows that, when the sheet concentration Ns of C exceeds a certain boundary value, the buffer leakage current further greatly decreases to about $1\times10^{-9}$ (A). The larger the Al composition y of the $Al_yGa_{1-y}N$ layer 13b is, the larger the boundary value is, and the boundary value when y=0.1, 0.2 and 0.3 are respectively about $5\times10^{12}$ $(cm^{-2})$, $1\times10^{13}$ $(cm^{-2})$ and $1.5\times10^{13}$ $(cm^{-2})$.

This boundary value is substantially equal to the polarization charge density Np at the interface between the $Al_yGa_{1-y}N$ layer 13b and the $Al_xGa_{1-x}N$ layer 13a (x is as small as not more than 0.05 and it is thus possible to handle as a GaN layer as an approximation), the polarization charge density Np calculated from the above-mentioned relational expression shown in "Journal of Applied Physics, Vol. 87, page 334 (2000) by O Ambacher et al.", which is "polarization charge density Np at an interface between the AlGaN layer and the GaN layer is $Np=5\times10^{13}\cdot x$ $(cm^{-2})$ when the Al composition x of the $Al_xGa_{1-x}N$ layer is x≤0.6 and $Np=1\times10^{14}\cdot x-3\times10^{13}$ $(cm^{-2})$ when x>0.6". It is considered that this is because an acceptor at a sheet concentration equivalent to the polarization charge density Np is required in order to compensate the induced charge caused by the polarization charge.

Therefore, a high suppressive effect on the buffer leakage current is obtained when the sheet concentration Ns of the acceptor in the $Al_yGa_{1-y}N$ layer 13b is higher than the polarization charge density Np of the $Al_yGa_{1-y}N$ layer 13b, i.e., is higher than $5\times10^{13}\cdot y$ $(cm^{-2})$ when the Al composition y is y≤0.6 and higher than $1\times10^{14}\cdot y-3\times10^{13}$ $(cm^{-2})$ when y>0.6.

The reason why the buffer leakage current decreases with an increase in the sheet concentration Ns of the acceptor is considered that the Fermi level position in the buffer layer 13 is stable when the sheet concentration Ns of the acceptor is higher. It is believed that this is because the introduced acceptor compensates not only simply the induced charge caused by the polarization charge in the buffer layer 13b but also compensates residual donor impurities contained in the $Al_xGa_{1-x}N$ layer 13a or the $Al_yGa_{1-y}N$ layer 13b. In general, the sheet concentration of the residual donor impurity in the buffer layer is controlled to the extent that does not affect on the sheet concentration of free electron in the channel layer (about 1 to $2\times10^{13}$ $(cm^{-2})$), and is at worst not more than half of the sheet concentration of the channel layer, not more than about $1\times10^{13}$ $(cm^{-2})$.

Figure 4:
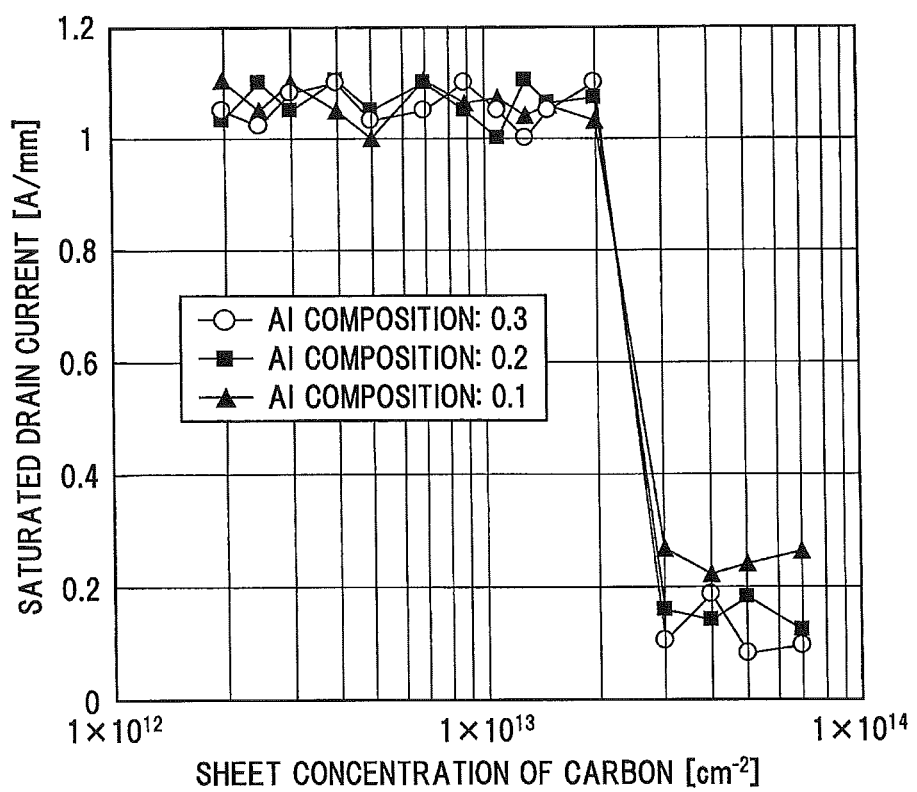
FIG. 4 is a graph showing a relation between a sheet concentration Ns of C in the $Al_yGa_{1-y}N$ layer and saturated drain current in the HEMT of the present embodiment.

Evaluation of Acceptor Concentration Dependence of Carrier Conduction Characteristics FIG. 4 is a graph showing a relation between a sheet concentration Ns of C as an acceptor and saturated drain current in the HEMT 2 of the present embodiment. In FIG. 4, a horizontal axis represents the sheet concentration Ns $(cm^{-2})$ of C contained per $Al_yGa_{1-y}N$ layer 13b and a vertical axis represents a saturated drain current (A/mm) FIG. 4 shows the measurement results of three types of HEMTs 2 of which $Al_yGa_{1-y}N$ layers 13b respectively have the Al compositions y of 0.1, 0.2 and 0.3. Note that, the structure of the members other than the $Al_yGa_{1-y}N$ layer 13b is the same in all HEMTs 2.

FIG. 4 shows that the saturated drain current drops sharply when the sheet concentration Ns of C as the acceptor exceeds $2\times10^{13}$ $(cm^{-2})$. It is considered that this is because free electrons in the channel layer are captured by the acceptor since the sheet concentration Ns of the acceptor in the $Al_yGa_{1-y}N$ layer 13b is too high with respect to the sheet concentration of the free electron in the channel layer 21 and this causes drastic shift of the Fermi level position. Therefore, the sheet concentration Ns of the acceptor per $Al_yGa_{1-y}N$ layer 13b is preferably $2\times10^{13}$ $(cm^{-2})$.

In field-effect transistor (FET)-based devices including the HEMT, any sheet concentration of free electron in a channel layer is as close as about $1\times10^{13}$ to $2\times10^{13}$ $(cm^{-2})$ in many cases. Therefore, even when the nitride semiconductor wafer 1 is used to form a FET-based device other than the HEMT 2, it is preferable that the sheet concentration Ns of the acceptor per $Al_yGa_{1-y}N$ layer 13b be not more than $2\times10^{13}$ $(cm^{-2})$.

Here, when "Ns>$5\times10^{13}\cdot y$ $(cm^{-2})$ when y≤0.6 and Ns>$1\times10^{14}\cdot y-3\times10^{13}$ $(cm^{-2})$ when y>0.6", which is the condition for obtaining the above-mentioned high suppressive effect on the buffer leakage current, is combined with "Ns≤$2\times10^{13}$ $(cm^{-2})$" which is a condition for not preventing carrier conduction in the channel layer 21, the relation in the former condition is Ns>$2\times10^{13}$ $(cm^{-2})$ when y>0.4, hence, "$0<y\le0.4$ as well as $5\times10^{13}\cdot y<Ns\le2\times10^{13}$ $(cm^{-2})$".

Therefore, in order to effectively suppress buffer leakage current without preventing the carrier conduction in the channel layer 21, it is preferable that the $Al_yGa_{1-y}N$ layer 13b satisfy the condition of "$0<y\le0.4$ as well as $5\times10^{13}\cdot y<Ns\le2\times10^{13}$ $(cm^{-2})$".

It should be noted that, when the same tests were conducted by doping Fe and Zn into the $Al_yGa_{1-y}N$ layer 13b instead of using C, the similar measurement results were obtained and it was found that the similar conditions allow buffer leakage current to be effectively suppressed without preventing the carrier conduction in the channel layer 21. Furthermore, the same applies to the case where a combination of two or three of C, Fe and Zn was doped into the $Al_yGa_{1-y}N$ layer 13b.

Although the Al composition y and the sheet concentration Ns of C are respectively equal in all of the $Al_yGa_{1-y}N$ layers 13b in the present example, the same effects are obtained as long as at least the uppermost $Al_yGa_{1-y}N$ layer 13b which is closest to the channel layer 21 satisfies the above-mentioned conditions "$0<y\leq0.4$ as well as $5\times10^{13}\cdot y<Ns\leq2\times10^{13}$ $(cm^{-2})$".

The invention according to claims is not to be limited to the above-mentioned embodiment and example. Further, please note that all combinations of the features described in the embodiment and example are not necessary to solve the problem of the invention.

What is claimed is:

1. A high-electron-mobility transistor nitride semiconductor wafer, comprising:
    a substrate;
    a buffer layer formed on the substrate and comprising an alternating layer of an $Al_xGa_{1-x}N$ ($0\leq x\leq0.05$) layer and an $Al_yGa_{1-y}N$ ($0<y\leq1$ and $x<y$) layer;
    a nitride semiconductor channel layer formed on the buffer layer; and
    a nitride semiconductor barrier layer formed on the channel layer,
    wherein only the $Al_yGa_{1-y}N$ layer of the alternating layer is doped with an acceptor.

2. The high-electron-mobility transistor nitride semiconductor wafer according to claim 1, wherein a sheet concentration Ns of the acceptor in an uppermost $Al_yGa_{1-y}N$ layer among the $Al_yGa_{1-y}N$ layer of the alternating layer is not more than $2\times10^{13}$ $cm^{-2}$.

3. The high-electron-mobility transistor nitride semiconductor wafer according to claim 2, wherein an Al composition y of the uppermost $Al_yGa_{1-y}N$ layer is $0<y\leq0.4$, and
    wherein the sheet concentration Ns is $5\times10^{13}\cdot y<Ns\leq2\times10^{13}$ $cm^{-2}$.

4. The high-electron-mobility transistor nitride semiconductor wafer according to claim 1, wherein the acceptor comprises one of iron (Fe), carbon (C), and zinc (Zn).

5. The high-electron-mobility transistor nitride semiconductor wafer according to claim 1, wherein an Al composition x of the $Al_xGa_{1-x}N$ layer is $x=0$.

6. The high-electron-mobility transistor nitride semiconductor wafer according to claim 1, wherein an Al composition y and a sheet concentration Ns per layer are each equal in the $Al_yGa_{1-y}N$ layer of the alternating layer.

7. The high-electron-mobility transistor nitride semiconductor wafer according to claim 1, wherein the $Al_xGa_{1-x}N$ layer of the alternating layer is not doped with the acceptor.

8. A nitride semiconductor wafer for using in a high-electron-mobility transistor, the nitride semiconductor wafer comprising:
    a substrate;
    a buffer layer formed on the substrate and comprising an alternating layer of an $Al_xGa_{1-x}N$ ($0\leq x\leq0.05$) layer and an $Al_yGa_{1-y}N$ ($0<y\leq1$ and $x<y$) layer;
    a nitride semiconductor channel layer formed on the buffer layer; and
    a nitride semiconductor barrier layer formed on the channel layer,
    wherein only the $Al_yGa_{1-y}N$ layer of the alternating layer is doped with an acceptor.

9. The high-electron-mobility transistor nitride semiconductor wafer according to claim 1, further comprising:
    a source electrode, a drain electrode, and a gate electrode formed on the barrier layer.

10. The high-electron-mobility transistor nitride semiconductor wafer according to claim 9, wherein the source electrode, the drain electrode, and the gate electrode are disposed on an upper surface of the barrier layer.

11. The high-electron-mobility transistor nitride semiconductor wafer according to claim 10, wherein the channel layer is disposed on a bottom surface of the barrier layer.

12. The high-electron-mobility transistor nitride semiconductor wafer according to claim 11, wherein a bottom surface of the channel layer is disposed on an upper surface of the buffer layer.

13. The high-electron-mobility transistor nitride semiconductor wafer according to claim 12, further comprising:
    a GaN layer disposed on a bottom surface of the buffer layer.

14. The high-electron-mobility transistor nitride semiconductor wafer according to claim 13, wherein the GaN layer is further disposed on an upper surface of the substrate.

15. The high-electron-mobility transistor nitride semiconductor wafer according to claim 1, wherein the substrate comprises one of a non-doped GaN substrate and a Fe-doped GaN substrate.

16. The high-electron-mobility transistor nitride semiconductor wafer according to claim 15, wherein the channel layer comprises one of a GaN crystal and an InGaN crystal.

17. The high-electron-mobility transistor nitride semiconductor wafer according to claim 16, wherein the barrier layer comprises one of an AlGaN crystal and an InAlN crystal.

18. The high-electron-mobility transistor nitride semiconductor wafer according to claim 17, further comprising:
    a source electrode, a drain electrode, and a gate electrode formed on the barrier layer,
    wherein the source electrode and the drain electrode comprise a laminate of Ti/Al, and the gate electrode comprises a laminate of Pd/Au.

19. The nitride semiconductor wafer according to claim 8, further comprising:
    a source electrode, a drain electrode, and a gate electrode formed on the barrier layer,
    wherein the source electrode, the drain electrode, and the gate electrode are disposed on an upper surface of the barrier layer,
    wherein the channel layer is disposed on a bottom surface of the barrier layer, and
    wherein a bottom surface of the channel layer is disposed on an upper surface of the buffer layer.

20. The nitride semiconductor wafer according to claim 8, wherein the channel layer comprises one of a GaN crystal and an InGaN crystal,
    wherein the barrier layer comprises one of an AlGaN crystal and an InAlN crystal,
    wherein the nitride semiconductor wafer further comprises a source electrode, a drain electrode, and a gate electrode formed on the barrier layer, and
    wherein the source electrode and the drain electrode comprise a laminate of Ti/Al, and the gate electrode comprises a laminate of Pd/Au.

* * * * *